(12) United States Patent
Bickford et al.

(10) Patent No.: US 7,487,476 B2
(45) Date of Patent: Feb. 3, 2009

(54) METHOD FOR COMPUTING THE SENSITIVITY OF A VLSI DESIGN TO BOTH RANDOM AND SYSTEMATIC DEFECTS USING A CRITICAL AREA ANALYSIS TOOL

(75) Inventors: Jeanne P. Bickford, Essex Junction, VT (US); Jason D. Hibbeler, Williston, VT (US); Juergen Koehl, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 11/279,300

(22) Filed: Apr. 11, 2006

(65) Prior Publication Data

US 2007/0240085 A1    Oct. 11, 2007

(51) Int. Cl.
*G06F 17/50* (2006.01)
(52) U.S. Cl. .............................. 716/4; 716/5
(58) Field of Classification Search ............... 716/4–5; 714/2, 25, 41–44, 47, 736–737, 779; 438/12, 438/14, 17–18
See application file for complete search history.

(56) References Cited

U.S. PATENT DOCUMENTS

| | | | | |
|---|---|---|---|---|
| 6,170,078 B1 * | 1/2001 | Erle et al. | | 716/4 |
| 7,024,642 B2 * | 4/2006 | Hess et al. | | 716/4 |
| 7,356,787 B2 * | 4/2008 | Yan et al. | | 716/4 |
| 2006/0265684 A1 * | 11/2006 | Buehler et al. | | 716/12 |
| 2007/0294648 A1 * | 12/2007 | Allen et al. | | 716/4 |

* cited by examiner

*Primary Examiner*—Paul Dinh
(74) *Attorney, Agent, or Firm*—Gibb Intellectual Property Law Firm, LLC; Ryan K. Simmons, Esq.

(57) ABSTRACT

A method of estimating integrated circuit yield comprises providing an integrated circuit layout and a set of systematic defects based on a manufacturing process. Next, the method represents a systematic defect by modifying structures in the integrated circuit layout to create modified structures. More specifically, for short-circuit-causing defects, the method pre-expands the structures when the structures comprise a higher systematic defect sensitivity level, and pre-shrinks the structures when the structures comprise a lower systematic defect sensitivity level. Following this, a critical area analysis is performed on the integrated circuit layout using the modified structures, wherein dot-throwing, geometric expansion, or Voronoi diagrams are used. The method then computes a fault density value, random defects and systematic defects are computed. The fault density value is subsequently compared to a predetermined value, wherein the predetermined value is determined using test structures and/or yield data from a target manufacturing process.

4 Claims, 2 Drawing Sheets

METHOD FOR COMPUTING THE SENSITIVITY OF A VLSI DESIGN TO BOTH RANDOM AND SYSTEMATIC DEFECTS USING A CRITICAL AREA ANALYSIS TOOL

BACKGROUND

1. Field of the Invention

Embodiments of the invention provide a method for computing the sensitivity of a VLSI design to both random and systematic defects using a critical area analysis tool.

2. Description of the Related Art

In the design and manufacture of very large scale integration (VLSI) semiconductor chips, two types of yield detractors in the manufacturing process are random defects and systematic defects. Random defects refer to electrical faults (e.g., opens and shorts) caused by foreign material or impurities. Systematic defects—also known as process-sensitive sites—constitute electrical faults that arise because of the inherent difficulty of repeatedly building certain structures in a given manufacturing technology.

Random defects are predicted using critical area. Critical area is a mathematical measure of the sensitivity of a VLSI layout to random defects. It is a function of the sizes of features and the spaces between features. There are several techniques for computing critical area (e.g., dot-throwing, geometric expansion, and Voronoi diagrams). Critical area models the sensitivity of a given manufacturing process to point defects. In the critical-area model, all shapes allowed in a technology are assumed to have equal defect sensitivity.

By contrast, systematic defects result because some structures are more difficult to manufacture than others. In a given process, certain geometrical configurations can be particularly susceptible to yield problems. For example: certain combinations of wide metal lines and narrow metal lines might interact in a certain way because of the polish stage and lead to electrical shorts and thus non-functional parts. In general, there is no simple way to measure the sensitivity of a design to systematic defects. One technique uses a design rule check (DRC) to look for certain configurations and then produce a raw count. While this technique provides a means of identifying sites that could cause yield issues, it does not allow yield to be predicted and does not provide a means to trade off options to lessen overall combined systematic and random yield sensitivity.

In addition there is a random component to systematic-defect analysis: a process-sensitive site is not guaranteed to cause an electrical fault but rather will cause a fault with some probability. An overall yield estimate for a semiconductor design therefore requires two separate analyses: critical area for random defects and quasi-DRC for systematic defects. Furthermore, the systematic-defect analysis should take into account the probabilistic nature of systematic defects. Presently, there is no good method for performing a unified analysis having these characteristics.

SUMMARY

Embodiments of the invention provide a method for computing the sensitivity of a VLSI design to both random and systematic defects using a critical area analysis (CAA) tool.

One method of estimating integrated circuit yield comprises providing an integrated circuit layout and a set of systematic defects based on a manufacturing process. Next, the method represents a systematic defect by modifying structures in the integrated circuit layout to create modified structures. More specifically, for defects causing a short circuit between electrically distinct shapes, the method pre-expands the structures when the structures comprise a higher systematic defect sensitivity level, and pre-shrinks the structures when the structures comprise a lower systematic defect sensitivity level. Conversely, for defects causing an open circuit in a shape, the method pre-shrinks the structures when the structures comprise a higher systematic defect sensitivity level and pre-expands the structures when the structures comprise a lower systematic defect sensitivity level.

Following this, a critical area analysis is performed on the integrated circuit layout using the modified structures, wherein dot-throwing, geometric expansion, or Voronoi diagrams are used. The method then computes a fault density value, wherein random defects and systematic defects are computed. The fault density value is subsequently compared to a predetermined value, wherein the predetermined value is determined using test structures and/or yield data from a target manufacturing process.

In other words, the method estimates integrated circuit yield, wherein the method identifies shape configurations susceptible to systematic defects and measures the sensitivity of the shape configurations to the systematic defects. Next, layout edges of the shape configurations are pre-expanded or pre-shrunk based on the sensitivity to the systematic defects. More specifically, for defects causing a short between two electrically distinct shapes, the layout edges are pre-expanded when the shape configurations comprise a higher systematic defect sensitivity level, and pre-shrunk when the shape configurations comprise a lower systematic defect sensitivity level.

A critical area analysis is then performed, comprising computing a fault density value. Specifically, dot-throwing, geometric expansion, or Voronoi diagrams are used to perform the critical area analysis. Further, the computing of the fault density value computes random defects and systematic defects. Following this, a size of the shape configurations are modified until the fault density value matches a predicted fault density, wherein the predicted fault density is determined using test structures and/or yield data from a target manufacturing process.

Another method of embodiments herein estimates integrated circuit yield, wherein the method provides an integrated circuit layout, test site data, and a set of systematic defects based on the test site data. Next, the method assigns each set of systematic defects a weight based on a probability of a fault occurring, wherein the weight is derived from test structures in technology test sites.

Following this, a critical area analysis is performed on the integrated circuit layout using the weight, wherein the critical area analysis performs dot-throwing, geometric expansion, or using Voronoi diagrams. The method then computes a fault density value, wherein random defects and systematic defects are computed. Subsequently, the fault density value is compared to a predetermined value.

In other words, the method estimates integrated circuit yield, wherein the method derives weighting factors for geometric configurations in an integrated circuit, wherein the weighting factors represent increased probabilities of a fault occurring at the geometric configurations. The weighting factors are derived from test structures in technology test sites. Next, one of the weighting factors is assigned to each of the geometric configurations based on the increased probabilities of the fault occurring at the geometric configurations.

Following this, a critical area analysis is performed using the weighting factors, wherein a fault density value is computed. The critical area analysis is performed using dot-throwing, geometric expansion, or Voronoi diagrams. Moreover, the computing of the fault density value computes random defects and systematic defects.

Accordingly, embodiments herein use the basic framework of critical area analysis to measure sensitivity to random defects. To account for systematic defects, the analysis is modified by giving higher weight to the faults involving geometric configurations that are known to be sensitive in the manufacturing process. The computed value from this procedure is thus no longer simply critical area but is instead weighted critical area.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
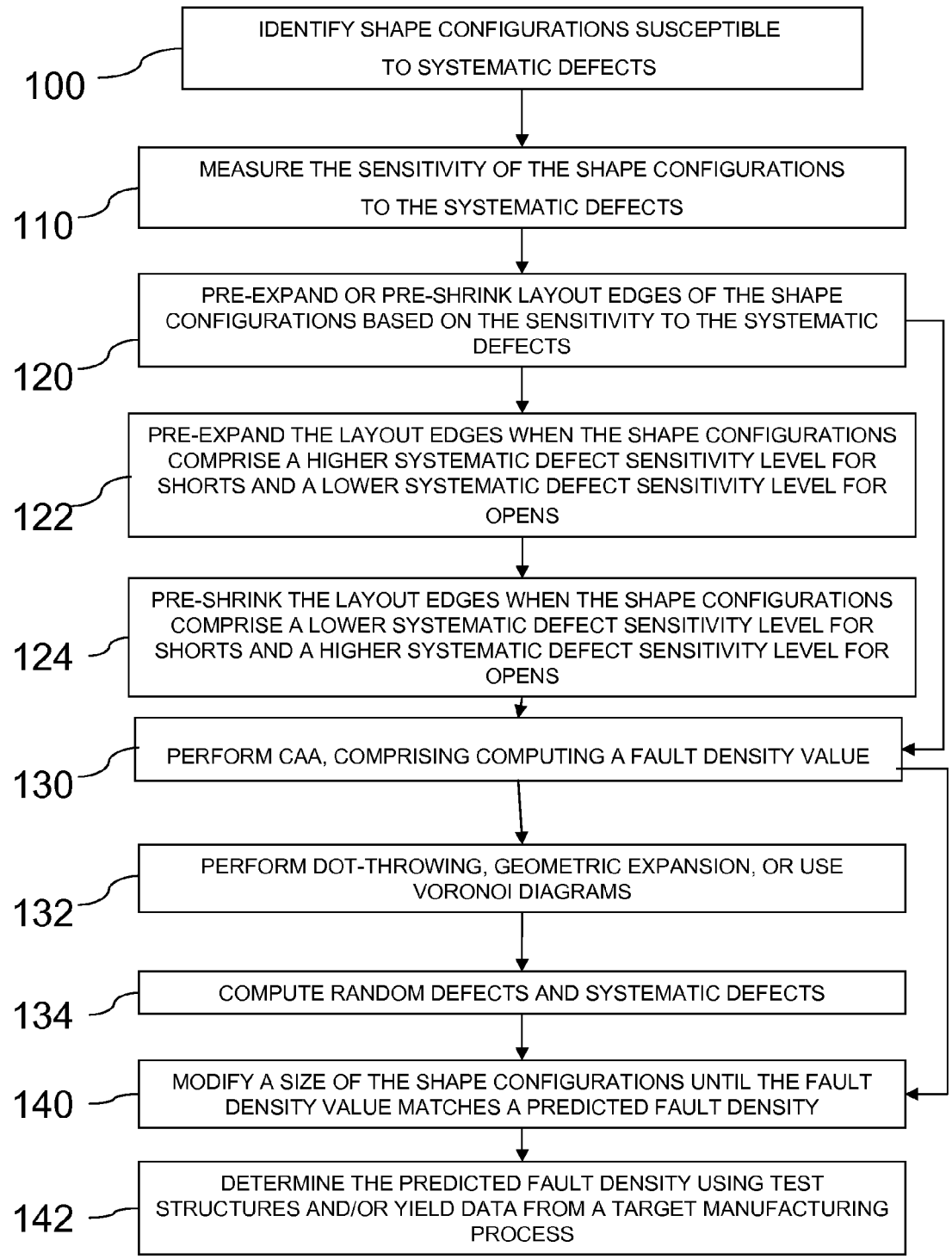
FIG. 1 is a flow diagram illustrating a method of estimating integrated circuit yield.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Accordingly, embodiments herein use the basic framework of critical area analysis to measure sensitivity to random defects. To account for systematic defects, the analysis is modified by giving higher weight to the faults involving geometric configurations that are known to be sensitive in the manufacturing process. The computed value from this procedure is thus no longer simply critical area but is instead weighted critical area.

As an example, a via near the edge of a wide metal line is particularly difficult to manufacture in the target manufacturing process because of variations in width of wide wires on the die (processes are usually tuned to eliminate variability in the widths of minimum-width wires). If the wire prints too narrow by twice the size of the via, then the via would not contact the wire at all, and the circuit could have an electrical open (assuming there were no redundant via set back from the edge of the wire). Thus, during the calculation for random-defect via opens, a higher weight is given to vias of this kind (via at the edge of a wide wire). A standard critical area analysis (CAA) tool is used to compute critical area for via blocks on the layer in question, but a higher weight is also assigned to certain vias as described above. The computed weighted critical area measures sensitivity to random defects and also to systematic defects of the type described. This single weighted CAA thus produces a value that can be used to obtain a more accurate yield estimate and requires only a single analysis of the layout data.

A standard CAA technique is used to measure sensitivity to random defects, using one of the three principal CAA methods: dot-throwing, geometric expansion, or Voronoi diagrams. Two approaches are provided to achieve this goal. The first approach involves expanding and/or shrinking of shapes. To measure sensitivity to systematic defects, shape configurations are identified that are susceptible to process problems. Then, pre-expanding or pre-shrinking of layout edges of the particular shapes corresponding to these sites is conducted and the CAA is performed. Each of the three main CAA techniques can be adapted in a straightforward manner to compute this weighted critical area.

In a dot-throwing example, minimum-width, minimum-space M3 lines lying above wide M2 lines are prone to shorting because of chemical-mechanical polish (CMP) problems. To account for this process sensitivity, the edges of these M3 lines are expanded by a small amount where they lie above the wide M2 wires. Then, CAA is performed to measure M3 shorts. Dots are more likely to cause shorts in the M3 lines that are expanded, which matches the fact that these lines are more sensitive to shorts for reasons other than just critical area.

For the example of vias at the edge of wide lines, the wide lines are pre-shrunk in the neighborhood of such vias. The "opens with via block" critical-area computation then records a higher incidence of dots that block these vias in the pre-shrunk lines.

The geometric-expansion technique involves repeated shape expansion of prescribed sizes. It's then natural to combine the expansion or shrinking of certain shapes with the overall expansion used in this technique.

In Voronoi-based methods, the coordinates of each layout edge enter into an analytic calculation for the critical area of number of disjoint polygons near that edge. The effect of expanding or shrinking an edge can be brought into this calculation by modifying the edge coordinates.

In each case, the amount by which a shape edge is shrunk or expanded is arrived at by calibration of this technique with yield data from the target manufacturing process, using carefully constructed test structures. If the failure rate for a given systematic defect is reported in parts-per-million (PPM), then the weighted-CAA technique is applied to the test layout using different expansion/shrink amounts until the overall fault density—for random defects plus PPM for systematic defects—matches the predicted fault density for the test data.

Therefore, this technique uses a given set of systematic defects for a given manufacturing process. For each kind of systematic defect, it is decided how to represent the effect of the defect as an expansion or shrink of specific layout edges (possibly on different layers). Next, a CAA is performed, taking the shrinks and expands into account to compute a total fault density number. Following this, the size of the various expand/shrink actions is modified until the computed fault density matches the predicted fault density for the test layout. The calibrated technique is then applied to general layouts.

The second approach involves a weighted CAA. This approach does not rely on shrinking or expanding shapes prior to CAA but rather to assigning weights to certain geometric configurations.

In the case of a dot-throwing approach to CAA, it is known for each dot the shape(s) for which the defect occurs. As an additional input, the increased probability of a fault for certain patterns is needed. If, for example, a short between adjacent minimum and wide wires occurs with a higher probability, the contribution of this dot to CAA is multiplied by the appropriate weight. In the case of a Voronoi CAA, a Voronoi polygon involving adjacent minimum-width and wide wires is given additional weight when its critical-area contribution is tallied.

Therefore, this technique is given a set of systematic defects for a given manufacturing process. Next, a weight is derived that is proportional to the increased probability of a fault for this geometric configuration. The standard weight is 1. Weights are derived from technology test sites. Technology test sites contain representative layouts that are suspected to have systematic-defect sensitivities. Yield of each systematic layout is measured on the technology test site, and a weighting factor is determined for each type of structure. Subsequently, a CAA is performed, using the weighting factors derived above, to compute a total fault density number. The calibrated technique is then applied to general layouts.

Thus, embodiments of the invention provide a method for computing the sensitivity of a VLSI design to both random and systematic defects using a critical area analysis tool.

One method of estimating integrated circuit yield comprises providing an integrated circuit layout and a set of systematic defects based on a manufacturing process. Next, the method represents a systematic defect by modifying structures in the integrated circuit layout to create modified structures. More specifically, for defects causing a short circuit, the method pre-expands the structures when the structures comprise a higher systematic defect sensitivity level, and pre-shrinks the structures when the structures comprise a lower systematic defect sensitivity level. As described above, the amount by which a shape edge is shrunk or expanded is arrived at by calibration of this technique on with yield data from the target manufacturing process, using carefully constructed test structures.

Following this, a critical area analysis is performed on the integrated circuit layout using the modified structures, wherein dot-throwing, geometric expansion, or Voronoi diagrams are used. As described above, in the dot-throwing example, minimum-width, minimum-space M3 lines lying above wide M2 lines are prone to shorting because of CMP problems. To account for this process sensitivity, the edges of these M3 lines are expanded by a small amount where they lie above the wide M2 wires. Then, the CAA is performed to measure M3 shorts. Dots are more likely to cause shorts in the M3 lines that are expanded, which matches the fact that these lines are more sensitive to shorts for reasons other than just critical area.

The method then computes a fault density value, wherein random defects and systematic defects are computed. The fault density value is subsequently compared to a predetermined value, wherein the predetermined value is determined using test structures and/or yield data from a target manufacturing process. As described above, if the failure rate for a given systematic defect is reported in parts-per-million (PPM) then the weighted-CAA technique is applied to the test layout using different expansion/shrink amounts until the overall fault density—for random defects plus PPM for systematic defects—matches the predicted fault density for the test data.

In other words, the method estimates integrated circuit yield, wherein the method identifies shape configurations susceptible to systematic defects and measures the sensitivity of the shape configurations to the systematic defects. Next, layout edges of the shape configurations are pre-expanded or pre-shrunk based on the sensitivity to the systematic defects. More specifically, for short-circuit-causing defects, the layout edges are pre-expanded when the shape configurations comprise a higher systematic defect sensitivity level, and pre-shrunk when the shape configurations comprise a lower systematic defect sensitivity level. And for open-circuit-causing defects, the layout edges are pre-shrunk when the shape configurations comprise a higher systematic defect sensitivity and pre-expanded when the shape configurations comprise a lower systematic defect sensitivity level. Again, as described above, the amount by which a shape edge is shrunk or expanded is arrived at by calibration of this technique on with yield data from the target manufacturing process, using carefully constructed test structures.

A critical area analysis is then performed, comprising computing a fault density value. Specifically, dot-throwing, geometric expansion, or Voronoi diagrams are used to perform the critical area analysis. For example, as described above, the geometric-expansion technique involves repeated shape expansion of prescribed sizes. It's then natural to combine the expansion or shrinking of certain shapes with the overall expansion used in this technique.

Further, the computing of the fault density value computes random defects and systematic defects. Following this, a size of the shape configurations are modified until the fault density value matches a predicted fault density, wherein the predicted fault density is determined using test structures and/or yield data from a target manufacturing process. As described above, if the failure rate for a given systematic defect is reported in parts-per-million (PPM), then the weighted-CAA technique is applied to the test layout using different expansion/shrink amounts until the overall fault density—for random defects plus PPM for systematic defects—matches the predicted fault density for the test data.

Another method of embodiments herein estimates integrated circuit yield, wherein the method provides an integrated circuit layout, test site data, and a set of systematic defects based on the test site data. Next, the method assigns each set of systematic defects a weight based on a probability of a fault occurring, wherein the weight is derived from test structures in technology test sites. As described above, this approach does not rely on shrinking or expanding shapes prior to the CAA, but rather to assigning weights to certain geometric configurations.

Following this, a critical area analysis is performed on the integrated circuit layout using the weight, wherein the critical area analysis performs dot-throwing, geometric expansion, or using Voronoi diagrams. As described above, in the case of a dot-throwing approach to the CAA, it is known for each dot the shape(s) for which the defect occurs. As an additional input the increased probability of a fault for certain patterns is needed. If for example a short between adjacent minimum and a wide wires occurs with a higher probability, the contribution of this dot is multiplied to the CAA by the appropriate weight.

The method then computes a fault density value, wherein random defects and systematic defects are computed. Subsequently, the fault density value is compared to a predetermined value. As described above, the calibrated technique is then applied to general layouts.

In other words, the method estimates integrated circuit yield, wherein the method derives weighting factors for geometric configurations on an integrated circuit, wherein the weighting factors represent increased probabilities of a fault occurring at the geometric configurations. The weighting factors are derived from test structures in technology test sites. Next, one of the weighting factors is assigned to each of the geometric configurations based on the increased probabilities of the fault occurring at the geometric configurations. Again, as described above, this approach does not rely on shrinking or expanding shapes prior to the CAA, but rather to assigning weights to certain geometric configurations.

Following this, a critical area analysis is performed using the weighting factors, wherein a fault density value is computed. The critical area analysis is performed using dot-throwing, geometric expansion, or Voronoi diagrams. As described above, in the case of a Voronoi CAA, a Voronoi polygon involving adjacent minimum-width and wide wires is given additional weight when its critical-area contribution is tallied. Moreover, the computing of the fault density value computes random defects and systematic defects. As described above, the calibrated technique is then applied to general layouts.

FIG. 1 illustrates a flow diagram of a method for estimating integrated circuit yield. The method begins by identifying shape configurations susceptible to systematic defects (item 100) and measures the sensitivity of the shape configurations to the systematic defects (item 110). Next, layout edges of the shape configurations are pre-expanded or pre-shrunk based on the sensitivity to the systematic defects (item 120). More specifically, the layout edges are pre-expanded when the shape configurations comprise a higher systematic defect sensitivity level for shorts and a lower systematic defect sensitivity level for opens (item 122); and, pre-shrunk when the shape configurations comprise a lower systematic defect sensitivity level for shorts and a higher systematic defect sensitivity level for opens (item 124). As described above, the amount by which a shape edge is shrunk or expanded is arrived at by calibration of this technique on with yield data from the target manufacturing process, using carefully constructed test structures.

A critical area analysis is then performed, comprising computing a fault density value (item 130). Specifically, dot-throwing, geometric expansion, or Voronoi diagrams are used to perform the critical area analysis (item 132). For example, as described above, the geometric-expansion technique involves repeated shape expansion of prescribed sizes. It's then natural to combine the expansion or shrinking of certain shapes with the overall expansion used in this technique.

Further, the computing of the fault density value computes random defects and systematic defects (item 134). Following this, a size of the shape configurations are modified until the fault density value matches a predicted fault density (item 140), wherein the predicted fault density is determined using test structures and/or yield data from a target manufacturing process (item 142). As described above, if the failure rate for a given systematic defect is reported in parts-per-million (PPM), then the weighted-CAA technique is applied to the test layout using different expansion/shrink amounts until the overall fault density—for random defects plus PPM for systematic defects—matches the predicted fault density for the test data.

Figure 2:
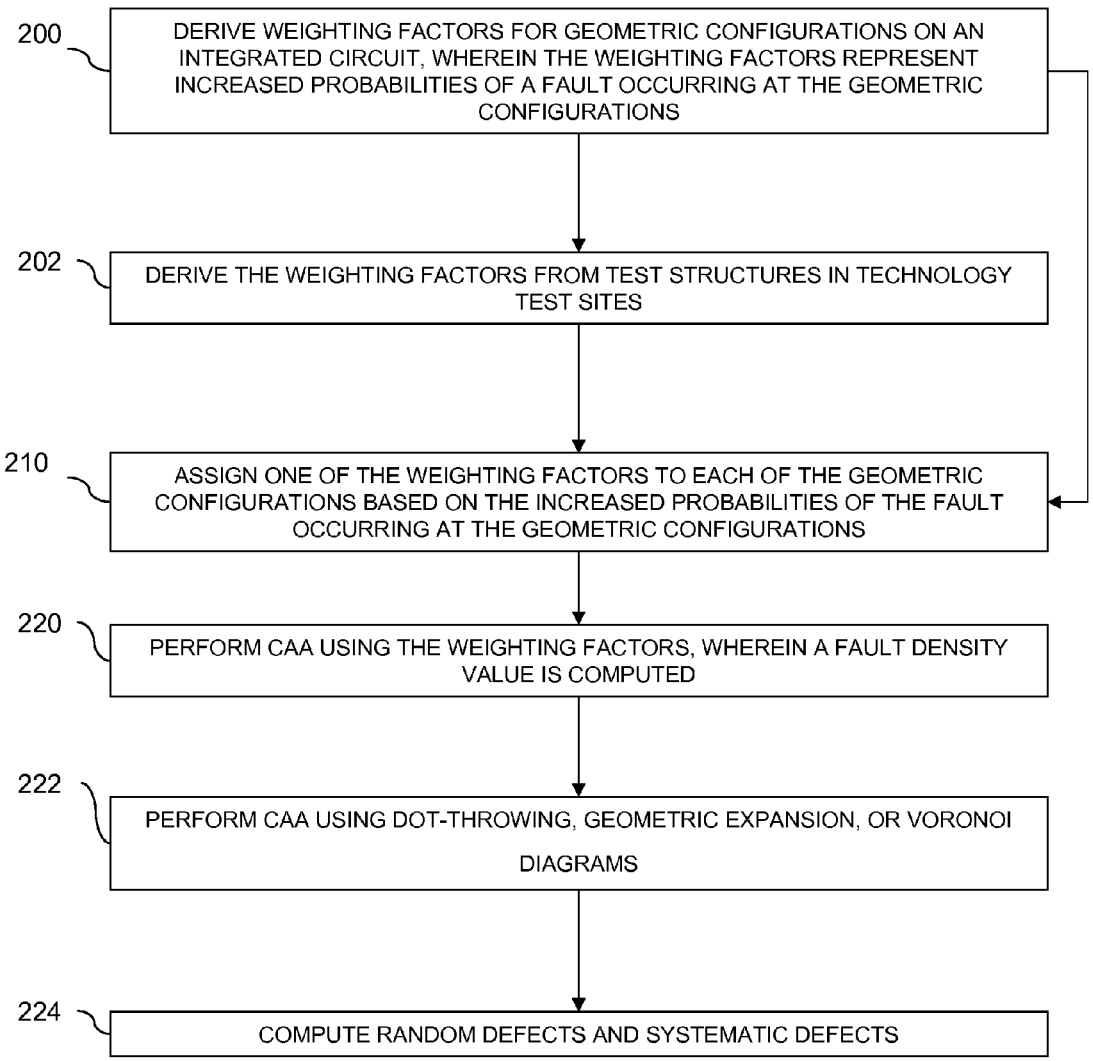
FIG. 2 is a flow diagram illustrating another method of estimating integrated circuit yield.

FIG. 2 illustrates a flow diagram for another method of estimating integrated circuit yield. The method begins by deriving weighting factors for geometric configurations on an integrated circuit, wherein the weighting factors represent increased probabilities of a fault occurring at the geometric configurations (item 200). The weighting factors are derived from test structures in technology test sites (item 202). Next, one of the weighting factors is assigned to each of the geometric configurations based on the increased probabilities of the fault occurring at the geometric configurations (item 210). As described above, this approach does not rely on shrinking or expanding shapes prior to the CAA, but rather to assigning weights to certain geometric configurations.

Following this, a critical area analysis is performed using the weighting factors, wherein a fault density value is computed (item 220). The critical area analysis is performed using dot-throwing, geometric expansion, or Voronoi diagrams (item 222). As described in the CMP-relegated example above, in the case of a Voronoi CAA, a Voronoi polygon involving adjacent minimum-width and wide wires is given additional weight when its critical-area contribution is tallied. Moreover, the computing of the fault density value computes random defects and systematic defects (item 224). As described above, the calibrated technique is then applied to general layouts.

Accordingly, embodiments herein use the basic framework of critical area analysis to measure sensitivity to random defects. To account for systematic defects, the analysis is modified by giving higher weight to the faults involving geometric configurations that are known to be sensitive in the manufacturing process. The computed value from this procedure is thus no longer simply critical area but is instead weighted critical area.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of estimating integrated circuit yield, comprising:

providing an integrated circuit layout;

providing a set of systematic defects based on a manufacturing process;

representing a systematic defect by modifying structures in said integrated circuit layout to create modified structures;

performing a critical area analysis on said integrated circuit layout using said modified structures;

computing a fault density value; and comparing said fault density value to a predetermined value, wherein said modifying of said structures comprises pre-expanding said structures when said structures comprise a higher systematic defect sensitivity level for short-circuit-causing defects and a lower systematic defect sensitivity level for open-circuit-causing defects, and wherein said modifying of said structures comprises pre-shrinking said structures when said structures comprise a lower systematic defect sensitivity level for short-circuit-causing defects and a higher systematic defect sensitivity level for open-circuit-causing defects.

2. The method according to claim 1, further comprising determining said predetermined value using at least one of test structures and yield data from a target manufacturing process.

3. The method according to claim 1, wherein said performing of said critical area analysis comprises performing one of dot-throwing, geometric expansion, and using Voronoi diagrams.

4. The method according to claim 1, wherein said computing of said fault density value comprises computing random defects and systematic defects.

* * * * *